US008268355B2

(12) United States Patent
Raccurt et al.

(10) Patent No.: US 8,268,355 B2
(45) Date of Patent: Sep. 18, 2012

(54) SILICA PARTICLE COMPRISING AN ORGANOLANTHANIDE COMPOUND, PREPARATION PROCESS THEREFOR AND USES THEREOF

(75) Inventors: Olivier Raccurt, Chelieu (FR); Daniel Imbert, Grenoble (FR); Marinella Mazzanti, Saint Martin le Vinoux (FR); Jorice Samuel, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 419 days.

(21) Appl. No.: 12/428,438
(22) Filed: Apr. 22, 2009
(65) Prior Publication Data
   US 2009/0270600 A1    Oct. 29, 2009
(30) Foreign Application Priority Data
   Apr. 23, 2008  (FR) .................................... 08 52724
(51) Int. Cl.
   *A61K 9/14*    (2006.01)
(52) U.S. Cl. ...................................... 424/489
(58) Field of Classification Search .................. None
   See application file for complete search history.
(56) References Cited

U.S. PATENT DOCUMENTS

| 5,245,026 A | 9/1993 | Johnson |
| 2005/0084451 A1 | 4/2005 | Hovinen |
| 2010/0247448 A1* | 9/2010 | Gateau et al. ............. 424/9.363 |

FOREIGN PATENT DOCUMENTS

| WO | 2007083036 A1 | 7/2007 |
| WO | WO 2007083036 A1 * | 7/2007 |

OTHER PUBLICATIONS

Ow, Hooisweng et al., "Bright and Stable Core-Shell Fluorescent Silica Nanoparticles", NanoLetters, vol. 5, No. 1, pp. 113-117 (2005).
Verhaegh, Nynke A.M. et al., "Dispersions of Rhodamine-Labeled Silica Spheres: Synthesis, Characterization, and Fluorescence Confocal Scanning Laser Microscopy", Langmuir, vol. 10, pp. 1427-1438 (1994).
Burns, Andrew et al., "Fluorescent core-shell silica nanoparticles: towards 'Lab on a Particle' architectures for Nanobiotechnology", Chem. Soc. Rev., 35, pp. 1028-1042 (2006).
Chen, Yang et al., "Dye sensitized luminescent europium nanoparticles and its time-resolved fluorometric assay for DNA", Analytica Chimica Acta, 587, pp. 180-186 (2007).
Yuan, Jingli et al., "Lanthanide-based luminescence probes and time-resolved luminescence bioassays", Trends in Analytical Chemistry, vol. 25, No. 5, pp. 490-500 (2006).
Harma, Harri et al., "Europium Nanoparticles and Time-resolved Fluorescence for Ultrasensitive Detection of Prostate-specific Antigen", Clin. Chem. vol. 47, No. 3, pp. 561-568 (2001).
Ye, Zhiqiang et al., "Preparation, characterization, and Time-Resolved Fluorometric Application of Silica-Coated Terbium (III) Fluorescent Nanoparticles", Anal. Chem. 76, pp. 513-518 (2004).
Ye, Zhiqiang et al., "Novel fluorescent europium chelate-doped silica nanoparticles: preparation, characterization and time-resolved fluorometric application", J. Mater. Chem., 14, pp. 851-856 (2004).
Tan, Mingqian et al., "Synthesis and characterization of titania-based monodisperse fluorescent europium nanoparticles for biolabeling", Journal of Luminescence, 117, pp. 20-28 (2006).
Hakala, Harri et al., "Synthesis and properties of nanospheres copolymerised with luminescent europium (III) chelates", Org. Biomol. Chem. 4, pp. 1383-1386 (2006).
Santra, Swadeshmukul et al., "Synthesis and Characterization of Fluorescent, Radio-Opaque, and Paramagnetic Silica Nanoparticles for Multimodal Bioimaging Applications", Adv. Mater., 17, pp. 2165-2169 (2005).
Cross, Jason P., "A useful 8-hydroxyquinoline synthon", J. Chem. Research (S), pp. 704-705 (2003).
Gateau, Christelle et al., "Solid-state and solution properties of the lanthanide complexes of a new nonadentate tripodal ligand derived from 1,4,7-triazacyclononane", The Royal Society of Chemistry, Dalton Trans., pp. 2428-2433 (2003).
Goodwin, J.W. et al., "Functionalzation of collodial silica and silica surfaces via silylation reacons", Colloid Polym. Sci., vol. 268, No. 8, pp. 766-777 (1990).
Jesionowski, Teofil et al., "Preparation of the hydrophilic/hydrophobic silica particles", Colloids and Surfaces, Physiochemical and Engineering Aspects, vol. 207, No. 1, pp. 49-58 (2002). Wu, Zhijian et al., "Surface properties of submicrometer silica spheres modified with aminopropyltriethoxysilane and phenyltriethoxysilane", Journal of Colloid and Interface Science, 304, pp. 119-124 (2006).
Strober, Werner et al., "Controlled Growth of Monodisperse Silica Spheres in the Micron Size Range", Journal of Colloid and Interface Science 26, pp. 62-69 (1968).
Takalo, H. et al., "Synthesis and Luminescence of Novel EUIII Complexing Agents and Labels With 4-(Phenylethynl) Pyridine Subunits", Helvetica Chimica Acta, Verlag Helvetica Chimica Acta., Basel, CH, vol. 79, No. 3, pp. 789-802 (1996).
Ziessel, R. et al., "Lanthanide probes for luminescence microscopy and anion sensing", Journal of Alloys and Compounds, Elsevier Sequoia, Lausanne, CH, vol. 374, No. 1-2, pp. 283-288 (2004).
Nonat, A. et al., "Lanthanide Complexes of a Picolinate Ugand Derived from 1, 4, 7-Triazacyclononane with Potential Application in Magnetic Resonance Imaging and Time-Resolved Luminescence Imaging", Chemistry—A European Journal, Wiley—V C H Verlag GMBH & Co. KGAA, Weinheim, DE, vol. 12, pp. 7133-7150 (2006).
Cross, J. P. et al., "Studies on some mixed pyrido-phenol donor ligands as sensitisers for terbium (III)", Journal of Luminescence, Amsterdam, NL. vol. 110, No. 3, pp. 101-111 (2004).
European Search Report, EP 09 15 8262, dated Jun. 5, 2009.

* cited by examiner

*Primary Examiner* — Paul Dickinson
(74) *Attorney, Agent, or Firm* — Nixon Peabody LLP (57) ABSTRACT

The present invention relates to a silica particle comprising at least one complex of at least one lanthanide and of at least one ligand of formula (A)

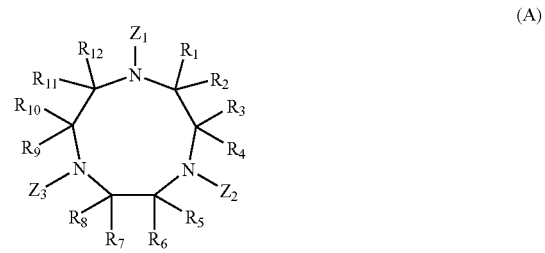

(A)

in which $Z_1$, $Z_2$ and $Z_3$, which may be identical or different, each represent a group bearing an atom bearing a lone pair and/or a negative charge; $R_1$, $R_2$, $R_3$, $R_4$, $R_5$, $R_6$, $R_7$, $R_8$, $R_9$, $R_{10}$, $R_{11}$ and $R_{12}$, which may be identical or different, each represent a hydrogen, an optionally substituted alkyl radical, an optionally substituted aryl radical, a halogen, a group —$OR_{13}$ or a group —$SR_{13}$, with $R_{13}$ representing H, an optionally substituted alkyl group or an optionally substituted aryl group.

16 Claims, 2 Drawing Sheets

SILICA PARTICLE COMPRISING AN ORGANOLANTHANIDE COMPOUND, PREPARATION PROCESS THEREFOR AND USES THEREOF

CROSS REFERENCE TO RELATED APPLICATIONS OR PRIORITY CLAIM

This application claims priority to French Patent Application No. 08 52724, filed Apr. 23, 2008.

DESCRIPTION

1. Technical Field

The present invention concerns the field of nanostructured silica particles.

The present invention more particularly relates to nanostructured silica particles containing lanthanide complexes, to a process for preparing them and to their use as multiluminescent tracers for use in anti-counterfeit marking and/or in biotechnology.

2. Prior Art

The idea of encapsulating fluorescent molecules in silica is now quite widespread. Many communications already relate this step [1], [2] and [3]. This recoating makes it possible to obtain a core/shell structure whose effects are mainly:

an increase in photostability due to the presence of the silica matrix which acts as a barrier, enhancement of the luminescence by regrouping several fluorescent molecules per nanoparticle, and increased compatibility of the nanoparticle with various media, especially biological media. This property is mainly due to the high surface reactivity of silica.

Such silica nanoparticles encapsulating fluorescent molecules may be used in many fields, such as biological tracers or for combating counterfeiting.

The prior art already describes silica nanoparticles combined with lanthanides. However, most of the work described in the literature associating silica nanoparticles and lanthanides concerns inorganic compounds, namely lanthanide oxides. The greatest drawback of these systems is the high energy required to sensitize the luminescence emission.

The incorporation of lanthanides into adapted organic molecules makes it possible to excite the luminescent emission at lower energies (UV-visible) by increasing the absorption coefficient via the "antenna" effect. Very few examples describe lanthanide organometallic complexes incorporated into silica nanoparticles, and all concern lanthanides that emit in the visible region.

The publication by Y. Chen and Z. Lu [4] describes a nanoparticle containing a europium (Eu)-based luminescent organometallic complex that serves as a fluorescent tracer for DNA recognition. This publication describes the incorporation of an Eu polyaminocarboxylate complex known as coumarin102-DTPA-Eu into a polyaminocarboxylate nanoparticle and not into a silica particle. The polyaminocarboxylate material limits, when compared with silica (or with polysiloxane), the possibilities of surface functionalization for the interface with living matter in the case of biological tracers or with the material to be marked for the use in anti-counterfeit marking.

Other publications describe the incorporation of organometallic complexes into latex nanoparticles with a diameter of about 107 nm [5] and [6]. In these publications and in two other references, the incorporation of organometallic complexes based on APS-BHHVT-$Eu^{3+}$ into a silica nanoparticle is described [5], [7] and [8]. The incorporation of complexes into zirconium beads for the production of biological tracers has also been published [9]. H. Hakala et al. [10] describe the incorporation of a europium complex (thienylpyridine and β-diketone) into polystyrene beads.

A publication by S. Santra et al. [11] describes a method of synthesis via a sol-gel route as a microemulsion of polysiloxane particles containing a $Gd^{3+}$-complexing ligand for the synthesis of a fluorescent biological tracer. The fluorescent function is obtained by means of incorporating Ru(bpy), which corresponds to tris(2,2'-bipyridyl)dichloro-ruthenium (II) hexahydrate. These nanoparticles have both a luminescence property due to the Ru(bpy) and a magnetic property due to the presence of $Gd^{3+}$; the luminescence function and the magnetic function are thus introduced by two different molecules. It is worthwhile pointing out that the molecule containing Gd is chemically bonded to the siloxane when the bead is synthesized. Specifically, during the sol-gel synthesis, this molecule bearing the lanthanide ion is introduced as precursor. During the sol-gel reaction, siloxane bridges are created with the silica precursor TEOS (tetraethyl orthosilicate) so as to insert the molecule via covalent bonding into the silica matrix.

A few examples of silica nanobeads incorporating lanthanide complexes that emit in the visible region have been described in the literature, but none of these examples concerns lanthanides that emit in the near infrared range.

There is thus a real need to provide other silica nanoparticles comprising fluorescent molecules and especially silica nanoparticles comprising lanthanide complexes that are capable of emitting fluorescence especially in the near infrared region.

DESCRIPTION OF THE INVENTION

The present invention enables the technical problems and drawbacks listed above to be solved. Specifically, this invention proposes, for the first time, the incorporation, into a silica particle, of a complex whose luminescence yield is improved and which, furthermore, emits in the near infrared region, doing so with a good luminescence yield.

The present invention uses the incorporation into silica particles of organometallic compounds based on rare-earth metals. The organometallic compounds used in the invention have the particular feature of being able to strongly complex a lanthanide ion even in aqueous solution and of sensitizing the fluorescence emission of certain rare-earth metals by means of efficient energy transfer. This type of organolanthanide molecule makes it possible not only to have the intrinsic luminescence of each lanthanide ion, but also to have excitation bands (wavelength range) determined by the organic part of the molecule. Thus, generally, the excitation bands of these molecules correspond to wavelengths that are longer than those for rare-earth metal oxides. Moreover, once the excitation energy has been absorbed by the organic part of the molecule, the structure of this molecule allows favourable energy transfer towards the lanthanide ion, by limiting the non-radiative de-excitations. The de-excitation of the lanthanide ion takes place by photon emission. The fluorescence spectrum is thus characteristic of the chosen lanthanide ion.

The present invention more particularly relates to a silica particle comprising at least one complex of at least one lanthanide and of at least one ligand of formula (A):

in which $Z_1$, $Z_2$ and $Z_3$, which may be identical or different, each represent a group bearing an atom bearing a lone pair and/or a negative charge, $R_1$, $R_2$, $R_3$, $R_4$, $R_5$, $R_6$, $R_7$, $R_8$, $R_9$, $R_{10}$, $R_{11}$ and $R_{12}$, which may be identical or different, each represent a hydrogen, an optionally substituted alkyl radical, an optionally substituted aryl radical, a halogen, a group —$OR_{13}$ or a group —$SR_{13}$, with $R_{13}$ representing H, an optionally substituted alkyl group or an optionally substituted aryl group.

In the context of the present invention, the lanthanide complexed with the ligand of formula (A) as defined above is chosen from the group constituted by cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). Advantageously, the lanthanide complexed with the ligand of formula (A) and as defined above is chosen from the group constituted by cerium (Ce), neodymium (Nd), europium (Eu), gadolinium (Gd), terbium (Tb), erbium (Er) and ytterbium (Yb). The said lanthanide is present, in the complex with the ligand of formula (A) in an oxidation state 3.

In the context of the present invention, the term "alkyl radical" means a linear, branched or cyclic, optionally substituted alkyl group of 1 to 20 carbon atoms, especially from 1 to 10 carbon atoms, in particular from 1 to 8 carbon atoms and most particularly from 1 to 6 carbon atoms.

In the context of the present invention, the term "aryl radical" means a monocyclic or polycyclic, optionally substituted aromatic group containing from 6 to 20 carbon atoms, especially from 6 to 14 carbon atoms and in particular from 6 to 8 carbon atoms.

In the context of the present invention, the term "optionally substituted" means a radical substituted with one or more groups chosen from: an alkyl group, an alkoxy group, a halogen, a hydroxyl, a cyano, a trifluoromethyl or a nitro.

In the context of the present invention, the term "alkoxy group" means an oxygen atom substituted with an alkyl as defined previously.

In the context of the present invention, the term "halogen" means a fluorine, chlorine, bromine or iodine.

The group bearing an atom bearing a lone pair of electrons and/or a negative charge used in the context of the present invention is a group involved in the complexation of metal ions and especially of lanthanide ions.

Advantageously, the said group bearing an atom bearing a lone pair of electrons and/or a negative charge bears at least one atom chosen from an oxygen atom, a nitrogen atom, a phosphorus atom, a sulfur atom and a carbon atom. These atoms may be included in functional groups such as a hydroxyl function, an ester function, a carboxylic acid function, an amine (primary, secondary or tertiary) function, an amide function, an oxime function, an isocyanate function, an isonitrile function, a hydrazine function, a hydrazone function, an imine function or a phosphine function.

In particular, the said group bearing an atom bearing a lone pair of electrons and/or a negative charge comprises, in addition to at least one of the abovementioned functions, at least one nitrogen atom bearing a lone pair of electrons, included in a saturated, unsaturated or aromatic ring. The said ring advantageously contains 3 to 8 carbon atoms.

In a first variant, at least one group bearing an atom bearing a lone pair of electrons and/or a negative charge that may be used in the context of the present invention is chosen from the group constituted by the groups —$R_{14}$—$COOR_{15}$, —$R_{14}$—$C_5H_3N$—$COOR_{15}$ and —$R_{14}$—$P(O)$—$OC(R_{15})_3$ with $R_{14}$ representing an optionally substituted alkyl radical as defined previously and $R_{15}$ representing a hydrogen or an optionally substituted alkyl radical as defined previously.

In a second variant, at least one group bearing at least one atom bearing a lone pair of electrons and/or a negative charge that may be used in the context of the present invention corresponds to formula (B) below:

(B)

in which $R_{21}$ represents a single bond or $R_{21}$ represents a radical =$CR_{23}$—, $R_{17}$ then being absent;

$R_{22}$ represents a single bond or $R_{22}$ represents a radical —$CR_{23}$=, $R_{19}$ then being absent;

$R_{16}$, $R_{17}$, $R_{18}$, $R_{19}$, $R_{20}$ and $R_{23}$, which may be identical or different, represent a hydrogen, an optionally substituted alkyl radical, an optionally substituted aryl radical, a halogen, a radical —$SO_3H$, a radical —$SO_3^-$, a group —$OR_{13}$ or a group —$SR_{13}$, with $R_{13}$ representing H, an optionally substituted alkyl group or an optionally substituted aryl group.

In this variant, particularly advantageous groups are:

the group ($B_1$) of formula (B) in which $R_{22}$ represents a radical —$C(SO_3^-)$= and $R_{16}$, $R_{17}$, $R_{18}$, and $R_{20}$ are as defined previously;

the group ($B_2$) of formula (B) in which $R_{16}$=$R_{18}$=$R_{20}$=H; $R_{21}$=a radical =CH— and $R_{22}$=a radical —CH=, $R_{17}$ and $R_{19}$ being absent;

the group ($B_3$) of formula (B) in which $R_{16}$=$R_{18}$=$R_{20}$=H; $R_{21}$=a radical =CH— and $R_{22}$=a radical —$C(SO_3^-)$=, $R_{17}$ and $R_{19}$ being absent.

In a third variant, at least one group bearing at least one atom bearing a lone pair of electrons and/or a negative charge that may be used in the context of the present invention is chosen from the group constituted by the groups of formulae (C), (D), (E), (F) and (H) below:

(C)

(D)

(E)

(F)

(H)

in which

G represents an O, N, P, S or a C independently substituted with a hydrogen, an optionally substituted alkyl radical or an optionally substituted aryl radical, the radicals $R_{24}$, $R_{25}$, $R_{26}$, $R_{27}$, $R_{28}$, $R_{29}$, $R_{30}$, $R_{31}$, $R_{32}$, $R_{33}$, $R_{34}$, $R_{35}$, $R_{36}$, $R_{37}$ and $R_{38}$, which may be identical or different, represent a hydrogen, an optionally substituted alkyl radical, an optionally substituted aryl radical, a halogen, a radical —$SO_3H$, a radical —$SO_3^-$, a group —$OR_{13}$ or a group —$SR_{13}$, with $R_{13}$ representing H, an optionally substituted alkyl group or an optionally substituted aryl group.

Advantageously, the radicals $R_{24}$ and $R_{25}$ and the radicals $R_{27}$ and $R_{28}$ are, in pairs, optionally substituted bridging alkyl or aryl radicals. Furthermore, G advantageously represents an oxygen.

A person skilled in the art knows different processes for preparing ligands of formula (A) and complexes comprising at least one lanthanide and at least one ligand of formula (A) that may be used in the context of present invention. By way of example, mention may be made of the preparation processes as described in international patent application WO 2007/083036-A1 [12], the article by Cross and Sammes, 2003 [13] and the article by Gateau et al., 2003 [14].

The groups $Z_1$, $Z_2$ and $Z_3$ may be chosen, independently of each other, from any of the above groups or variants.

The ligands of formula (A) used in the silica particles of the present invention are advantageously ligands in which the groups $Z_1$, $Z_2$ and $Z_3$ are identical. Thus, ligands that are particularly preferred in the context of the present invention are:

the ligand in which $Z_1=Z_2=Z_3=B_2$, referred to hereinbelow as $H_3$thqtcn;

the ligand in which $Z_1=Z_2=Z_3=B_3$, referred to hereinbelow as $H_3$thqtcn-$SO_3$;

the ligand in which $Z_1=Z_2=Z_3=$—$CH_2$—$C_5H_3N$—COOH, referred to hereinbelow as $H_3$tpatcn.

The structures of these three ligands are represented schematically below:

R = $H_8$    $H_3$thqtcn

R = $SO_3^-$    $H_3$thqtcn-SO3

$H_3$tpatcn

The complex of at least one lanthanide and/or at least one ligand of formula (A) used in the context of the present invention is in the form of a coordination complex of general formula (I)

$$[Ln(L)(H_2O)_n] \quad (I)$$

in which Ln represents a lanthanide as defined previously, L is a ligand of formula (A) as defined previously and n is an integer ranging from 0 to 6. Advantageously, n is equal to 1.

Advantageously, the silica particles used in the present invention are particles of nanometric to micrometric size. Thus, these particles have characteristic sizes of between 1 nm and 200 μm, especially between 2 nm and 30 μm and more specifically between 2 nm and 1 μm.

The silica particles according to the present invention may comprise several complexes of at least one lanthanide and of at least one ligand of formula (A) as defined previously. When several complexes are included in a silica particle according to the present invention, the ligands included in these complexes may be identical or different, as may the lanthanides included in these complexes. Thus, in the context of the present invention, silica particles comprising several complexes of the same ligand with the same lanthanide, of the same ligand with different lanthanides, of different ligands with the same lanthanide or of different ligands with different lanthanides may be envisaged.

In a first alternative, the complex of at least one lanthanide and of at least one ligand of formula (A) as defined previously, which the silica particle bears, is encapsulated in this particle. The silica particle used may especially be a porous silica bead or a silica particle prepared in the presence of the said complex.

In this alternative, the silica particles comprising a complex of at least one lanthanide and of at least one ligand of formula (A) as defined previously, encapsulated in the said particle, may also be functionalized.

In the context of the present invention, the term "functionalized" means a silica particle onto which is grafted, advantageously by covalent bonding, at least one molecule bearing a specific chemical function, the said chemical function ranging from amines to carboxyls, passing via the thiols [15], [16] or [17].

The functionalization of silica particles is well known in the prior art. The technique commonly used for this functionalization consists in using the surface reactivity of silica to react the Si—OH groups of the surface oxide with a function of the molecule to be grafted and especially a chlorosilane function. The other end of the molecule to be grafted contains the specific chemical function.

This alternative makes it possible not only to protect the complexes of at least one lanthanide and of at least one ligand of formula (A) from the surrounding medium, but also be able to dilute the said complexes in any solvent, which may be hydrophilic or hydrophobic, since the silica can be functionalized at will. Finally, this functionalization is particularly advantageous when the nanoparticles that are the subject of the invention are used in biology. This functionalization may, for example, contain DNA sequences for genome recognition, proteins for proteomic recognition, amine functions for dissolution in a biological buffer, etc. By virtue of this functionalization, the surface of the silica particles according to the present invention may also be made biocompatible with different enzymes.

The present invention also relates to a process for preparing a silica particle comprising at least one complex of at least one lanthanide and at least one ligand of formula (A) as defined previously and, more particularly, the alternative corresponding to a silica nanoparticle in which is encapsulated a complex of at least one lanthanide and of at least one ligand of formula (A), the said silica particle possibly being functionalized. The said process comprises the steps consisting in:

a) encapsulating, in a silica particle, at least one complex comprising at least one lanthanide and at least one ligand of formula (A) as defined previously, and b) optionally functionalizing the said silica particle obtained in step (a).

In a first embodiment of this process, step (a) consists in:

c) using a silica particle onto which is grafted at least one complex comprising at least one lanthanide and at least one ligand of formula (A) that may be obtained via the process as defined below (step (a') and optionally step (b') defined below), and then d) coating the said particle with a layer of silica.

In a second embodiment of this process, step (a) consists in:

e) placing in contact a porous silica particle with at least one ligand of formula (A) as defined previously, optionally complexed with at least one lanthanide as defined previously, f) optionally placing in contact the silica particle obtained in step (e) with at least one lanthanide as defined previously, g) optionally coating the particle obtained in step (f) with a layer of silica.

In this second embodiment, two cases may be envisaged. The first case corresponds to the case in which a complex of at least one lanthanide with at least one ligand of formula (A) is used in step (e), step (f) then being unnecessary.

For the second case, if only the ligand of formula (A) (i.e. in the absence of at least one lanthanide) is used during step (e), step (f) is necessary. In this case, the lanthanide(s) migrate(s) up to the ligand(s) via the pores of the porous silica particle in order for the organolanthanide complex(es) to be able to be formed. Step (f) consists in replacing the ion other than a lanthanide in the complex with the ligand of formula (A) with a lanthanide, the said ion generally being an $Na^+$ ion. Advantageously, the said replacement is performed by modulating the pH of the reaction medium in which step (f) is performed. This modulation may be a lowering or raising of the pH as a function of the ligand(s) used. The reaction medium used during step (f) is advantageously an aqueous medium.

In a third embodiment of this process, step (a) consists in:

h) placing in contact at least one complex comprising at least one lanthanide and at least one ligand of formula (A) as defined previously with at least one silica precursor under conditions for obtaining a silica particle, i) optionally, coating the said particle obtained in step (h) with a layer of silica.

During steps (c), (e), (f) and (h), a mixture of different lanthanides and/or of different ligands of formula (A) may be used.

Steps (d), (g), (h) and (i) are techniques that are well known to those skilled in the art of manufacturing silica particles or of manufacturing silica-coated materials, such as the sol-gel methods and especially the Ströber method [18]. These steps may consist in forming a water-in-oil microemulsion containing silica precursors, in which the growth of the silica layer will take place. During step (h) defined previously, the lanthanide complexes that have been dissolved in water will thus migrate within the silica precursors and become trapped in the silica matrix under construction. Silica precursors that may be mentioned include TEOS, TMOS (tetramethyl orthosilicate), APTES (aminopropyltriethoxysilane) and APTMS (aminopropyltrimethoxysilane).

In a second alternative, the complex of at least one lanthanide and of at least one ligand of formula (A) as defined previously, which the silica particle bears, is at the surface of the said silica particle. The said complex is thus grafted onto the surface of the silica particle.

This grafting advantageously involves a reactive group at the surface of the silica particle and a reactive group borne by the complex of at least one lanthanide and of at least one ligand of formula (A). The reactive group borne by the complex may borne by the radicals $R_{1-12}$ or $Z_{1-3}$ of the ligand of formula (A). The reactive group at the surface of the silica particle may be either naturally present at the surface of the silica particle (direct grafting) or brought thereto especially by functionalization (indirect grafting). This grafting advantageously involves a covalent bond between the two reactive groups. In this variant, the silica particle used may be a non-porous silica bead.

The present invention thus relates to a process for preparing a silica particle comprising at least one complex of at least one lanthanide and at least one ligand of formula (A) as defined previously and, more particularly, the alternative corresponding to a silica nanoparticle onto which is grafted a complex of at least one lanthanide and of at least one ligand of formula (A). This process comprises the following steps:

a') grafting, directly or indirectly, onto a silica particle at least one ligand of formula (A) optionally complexed with at least one lanthanide, b') optionally placing in contact the grafted silica particle obtained in step (a') with at least one lanthanide.

Advantageously, if step (a') is performed using a complex of at least one lanthanide with at least one ligand of formula (a), step (b') is unnecessary. On the other hand, if only the ligand of formula (A) (i.e. in the absence of at least one lanthanide) is used during step (a'), step (b') is necessary. The latter step consists in replacing the ion other than a lanthanide in the complex with the ligand of formula (A) with a lanthanide, the said ion generally being an $Na^+$ ion. Advantageously, the said replacement is performed by modulating the pH of the reaction medium in which step (b') is performed. This modulation may be a lowering or raising of the pH as a function of the ligand(s) used. The reaction medium used during step (b') is advantageously an aqueous medium. In step (b'), a mixture of different lanthanides may be used, and in a defined stoichiometry, so as to constitute a code that can be used in the various applications of the silica particles according to the present invention. Furthermore, once the lanthanide ion has been complexed with the ligand of formula (A), it is extremely difficult to dislodge it from the complex even in aqueous solution, which makes the complex very stable.

The ligands of formula (A) and especially of formula (B) used in the context of the present invention have numerous benefits and advantages, namely:

the possibility of incorporating the entire series of lanthanide ions onto the same type of molecule and thus of having access to different emission wavelengths, an absorption at about 390 nm, which is much higher than in the case of the oxides. This advantage makes it possible to have the fluorescence of the lanthanide ion with an excitation of relatively long wavelength, the same chemical behaviour irrespective of the lanthanide ion with which it is complexed. As a result, a mixture of several molecules with lanthanide ions will be homogeneous. This makes it possible to manufacture codes with a uniform dispersion of the molecules during the synthesis of the silica particles. The distribution of the code is then identical in each silica particle.

Furthermore, complexes comprising a lanthanide and at least one ligand of formula (A) and advantageously a ligand of formula (B) have advantageous photophysical properties in solution: high quantum luminescence yields, high solubility and stability in water. Specifically, the quantum luminescence yields obtained are among the highest so far described in the art. In addition, these complexes combine, for the first time, such quantum luminescence yields with very high stability in water.

Finally, the photophysical properties as described are conserved after the inclusion in silica. Such complexes thus make it possible to obtain silica particles incorporating such lanthanide complexes with an emission in the near infrared region. These systems are thus particularly advantageous for applications in biology and in imaging devices. Specifically, the silica particles according to the present invention contain an optical code that can serve for producing biological tracers or tracers for anti-counterfeit marking. Thus, the present invention relates to the use of a silica particle according to the present invention or of a silica particle that may be prepared via a preparation process according to the present invention, as biological tracers or as tracers for anti-counterfeit marking.

The use of a complex containing at least one ligand of formula (A) with an Yb, Er or Nd ion makes it possible to have luminescence in the infrared region. This luminescence is very advantageous for the application in the biomedical field and in the field of anti-counterfeiting since, in this case, there is a large wavelength gap between the excitation and the emission, and this wavelength is preferentially outside the visible range.

Furthermore, the use of the Gd ion in the complexes used in the context of the present invention makes it possible to have, in addition to the luminescence properties, a magnetic property. This affords the silica particle both luminescence properties (optical code) and magnetic properties. This additional property may serve, in case of a use as a tracer for combating counterfeiting, as a detection key or as an additional coding parameter. As regards combating counterfeiting, the use of functionalized or non-functionalized silica particles according to the present invention makes it possible to envisage introducing such particles into different solvents or polymers chosen as a function of the properties of the particles. It may be envisaged to introduce such functionalized or non-functionalized particles into a polymer such as a thermosetting polymer of the varnish type or the like. The varnish thus obtained may be applied or coated onto any object and especially onto fabrics or onto natural or synthetic rigid substrates (polymeric or metallic materials, oxides, etc.). The functionalized or non-functionalized silica particles that are the subject of the present invention introduced into a polymer to be coated onto supports of any type make it possible, by virtue of their properties, to give the coated material luminescence or magnetic properties.

For application as a biological tracer, it is generally necessary to have a simple optical signature and a magnetic signature. In this case, it is possible to incorporate into the silica particle both a complex with a ligand of formula (A) with a Gd ion (detection by magnetic resonance imaging, MRI) and another complex with a ligand of formula (A) with another rare-earth metal such as Tb or Eu (emission in the visible region) or such as Yb or Nd (emission in the infrared region.

The present invention also relates to some of the complexes used in the silica particles according to the invention.

Specifically, the assembly of 8-hydroxyquinolinate units or of units similar to 8-hydroxyquinolinate onto a tripodal nonadentate ligand makes it possible to establish well-defined neutral, monomeric tris-hydroxyquinolinate-based lanthanide complexes of a single type. In addition, whereas tridentate 2-carboxamide-8-hydroxyquinolines have recently led to the isolation of lanthanide complexes in different isomeric forms (syn or anti), the use of a tripodal anchor to organize the bidentate hydroxyquinolinate units leads to lanthanide complexes of a single type.

Thus, the present invention relates to a complex comprising at least one lanthanide and at least one ligand of formula (A)

(A)

in which $R_1, R_2, R_3, R_4, R_5, R_6, R_7, R_8, R_9, R_{10}, R_{11}$ and $R_{12}$, which may be identical or different, each represent a hydrogen, an optionally substituted alkyl radical, an optionally substituted aryl radical, a halogen, a group —$OR_{13}$ or a group —$SR_{13}$, with $R_{13}$ representing H, an optionally substituted alkyl group or an optionally substituted aryl group, $Z_1, Z_2$ and $Z_3$, which may be identical or different, each represent a group of formula (B) below:

(B)

in which

$R_{21}$ represents a single bond or $R_{21}$ represents a radical =$CR_{23}$—, $R_{17}$ then being absent;

$R_{22}$ represents a single bond or $R_{22}$ represents a radical —$CR_{23}$=, $R_{19}$ then being absent;

$R_{16}, R_{17}, R_{18}, R_{19}, R_{20}$ and $R_{23}$, which may be identical or different, represent a hydrogen, an optionally substituted alkyl radical, an optionally substituted aryl radical, a halogen, a radical —$SO_3H$, a radical —$SO_3^-$, a group —$OR_{13}$ or a group —$SR_{13}$, with $R_{13}$ representing H, an optionally substituted alkyl group or an optionally substituted aryl group.

The present invention also relates to the preferred complexes as defined previously and corresponding to this general definition.

The present invention also relates to some of the ligands used in the context of the silica nanoparticles according to the invention. Thus, the present invention relates to a ligand of formula (A)

(A)

in which $R_1, R_2, R_3, R_4, R_5, R_6, R_7, R_8, R_9, R_{10}, R_{11}$ and $R_{12}$, which may be identical or different, each represent a hydrogen, an optionally substituted alkyl radical, an optionally substituted aryl radical, a halogen, a group —$OR_{13}$ or a group —$SR_{13}$, with $R_{13}$ representing H, an optionally substituted alkyl group or an optionally substituted aryl group, $Z_1, Z_2$ and $Z_3$, which may be identical or different, each represent a group of formula (C) below:

(C)

in which $R_{21}$ represents a single bond or $R_{21}$ represents a radical =$CR_{23}$—, $R_{17}$ then being absent;

$R_{16}, R_{17}, R_{18}, R_{20}$ and $R_{23}$, which may be identical or different, represent a hydrogen, an optionally substituted alkyl radical, an optionally substituted aryl radical, a halogen, a radical —$SO_3H$, a radical —$SO_3^-$, a group —$OR_{13}$ or a group —$SR_{13}$, with $R_{13}$ representing H, an optionally substituted alkyl group or an optionally substituted aryl group.

The present invention also relates to the preferred ligands described in the present invention and corresponding to the above general definition.

The other characteristics and advantages of the present invention will emerge more clearly to a person skilled in the art on reading the examples below, given as non-limiting illustrations, and with reference to the attached figures.

DETAILED DESCRIPTION OF PARTICULAR EMBODIMENTS

I. Synthesis and Characterization of the Ligands

I.1. Synthesis of $H_3$thqtcn: 1,4,7-tris[2-(8-hydroxyquinolinyl)methyl]-1,4,7-triazacyclononane The ligand $H_3$thqtcn was synthesized, in four steps, from commercially available products and according to the protocol described by J. P. Cross and P. G. Sammes [13], slightly modified, since this modification resulted in a large increase in yield (11% vs 4%).

A solution of ester of 1,4,7-tris[2-(8-(2,2-dimethylpropanoyloxy)quinolinyl)methyl]-1,4,7-triazacyclononane (1.171 g, 1.37 mmol) in degassed THF (30 mL) was added to a degassed solution of KOH in MilliQ water (10 mL, 12.35 mmol). The solution thus obtained was mixed at room temperature for 6 days and then neutralized (pH=7) by adding aqueous 1M HCl solution (6 mL). The crude product was extracted with ethyl acetate (75 mL) and the organic layer washed with saturated aqueous $NaHCO_3$ solution (5×15 mL), and then with saturated aqueous NaCl solution (5×15 mL) and finally dried over anhydrous $Na_2SO_4$. After evaporating off the solvent, the residue was triturated from ether to give $H_3$thqtcn. $0.5H_2O$. 0.2 KCl as a pale yellow solid (0.608 g, 74%).

$^1$H-NMR ($D_2O$, 400 MHz, 298 K, pD=1.4): δ=3.55 (s, 12H, $N(CH_2)_2N$), 4.0 (s, 6H, $N(CH_2)$qui), 6.81 (d, J=8.0 Hz, 3H, $H_{10}$), 7.21 (d, J=8.0 Hz, 3H, $H_8$), 7.26 (t, J=8.0 Hz, 3H, $H_9$), 7.44, (d, J=8.8 Hz, 3H, $H_6$), 8.15 (d, J=8.8 Hz, 3H, $H_7$).

ES-MS m/z (%): 601.3 (100) $[M+H]^+$, 623.3 (7) $[M+Na]^+$.

Anal. Calc. for $H_3$thqtcn; C, $0.5H_2O$. 0.2KCl; $C_{36}H_{37}N_6O_{3.5}K_{0.2}Cl_{0.2}$ (624.64): C, 69.22; H, 5.97; N, 13.45. found: C, 69.29; H, 6.01; N, 13.22%.

I.2. Synthesis of $H_6$thqtcn-$SO_3$: 1,4,7-tris[2-(5-sulfo-8-hydroxyquinolinyl)methyl]-1,4,7-triaza-cy-clononane The ligand $H_3$thqtcn (0.104 g, 0.17 mmol) was covered with a minimum amount of oleum ($H_2SO_4/SO_3$ 20%, 1.5 mL). The mixture was stirred overnight at room temperature and then poured onto ice. The solution was evaporated to dryness and then dissolved in EtOH. Slow evaporation of the solution at 4° C. produced a yellow precipitate of a tris-protonated form of the ligand $H_6$thqtcn-$SO_3$. $6H_2O$. $0.3H_2SO_4$ (0.134 g, 92%).

$^1$H-NMR ($D_2O$, 400 MHz, 298 K, pD=8.3): δ=2.95 (s, 12H, $N(CH_2)_2N$), 3.85 (s, 6H, $N(CH_2)$qui), 6.66 (d, J=7.6 Hz, 3H, $H_{10}$), 7.60 (d, J=7.6 Hz, 3H, $H_9$), 7.72 (t, J=7.6 Hz, 3H, $H_7$), 8.75, (d, J=7.6 Hz, 3H, $H_6$).

ES-MS m/z (%): 641.2 (100) $[M+H]^+$.

Anal. Calc. for $H_6$thqtcn-$SO_3$. $6H_2O$. $0.3H_2SO_4$; $C_{36}H_{48.6}N_6O_{13.2}S_{3.3}$ (978.40): C, 44.23; H, 4.95; N, 8.60. Found: C, 44.07; H, 4.99; N, 8.63%.

The high solubility of the ligand $H_6$thqtcn-$SO_3$ made it possible to determine its deprotonation constants by potentiometric titration of the protonated form $H_x$thqtcn-$SO_3$ of the ligand with KOH in KCl at 0.1M at 298 K. The fully protonated form $H_{12}$thqtcn-$SO_3$ of the ligand has 12 deprotonation sites, 3 pyridinium groups, 3 tertiary nitrogens, 3 hydroxyl oxygens and 3 sulfonic groups. The three sulfonates are fully deprotonated under the experimental conditions used. The deprotonation constants of $H_9$thqtcn-$SO_3{}^{3+}$ are defined as $K_{ai}=[H_{9-i}L]^{(1-i)}[H]^+/[H_{8-i}L]^{(2-i)+}$. Analysis of the potentiometric curves enabled precise determination of 6 deprotonation constants ($pKa_8$=2.9(2), $pKa_7$=5.34(5), $pKa_6$=8.01(8), $pKa_5$=8.78(1), $pKa_4$=8.98(4), $pKa_3$=10.25(2)), whereas it was possible only to obtain the sum $pKa_1+pKa_2$=(22.51(3)).

I.3. Synthesis of $H_3$tpatcn: 1,4,7-Tris[(6-(carboxypy-rid-2-yl)methyl]-1,4,7-triazacyclononane This synthesis was performed according to the protocol described by Gateau et al., 2003 [14].

II. Synthesis and Characterization of the Lanthanide Complexes

II.1. Complex [Ln(thqtcn)] with Ln=Nd, Er, Yb

A solution of $Ln(OTf)_3$ (Ln=Nd, Er, Yb) (0.09 mmol) in methanol (4 mL) was added to a solution of $H_3$thqtcn (0.09 mmol) in methanol (4 mL). The addition of 0.85 equivalent of aqueous 1 M KOH solution gave a clear yellow solution, which was refrigerated at 4° C. overnight. The KOTf was removed by filtration. Slow diffusion of a KOH solution (additional 3.3 equivalents) into the resulting solution at 4° C. led to the formation of a microcrystalline yellow solid, which was separated out by filtration, washed with methanol and MilliQ water, and dried under high vacuum for two days to obtain the complex [Ln(thqtcn)] (48-79%).

Anal. Calc. [Nd(thqtcn)], $C_{36}H_{33}N_6O_3Nd$: C, 58.28; H, 4.48; N, 11.33. Found: C, 58.89; H, 4.52; N, 11.14%. Anal. Calc. for [Er(thqtcn)], $C_{36}H_{33}N_6O_3Er$: C, 56.53; H, 4.35; N, 10.99. Found: C, 56.98; H, 4.22; N, 10.73%. Anal. Calc. for [Yb(thqtcn)], $C_{36}H_{33}N_6O_3Yb$: C, 56.10; H, 4.32; N, 10.90. Found: C, 55.81; H, 4.06; N, 10.65%.

The elemental analyses of all the complexes are compatible with the presence of analytically pure [Ln(thqtcn)] species. These complexes are insoluble in all the commonly used laboratory solvents.

Figure 1:
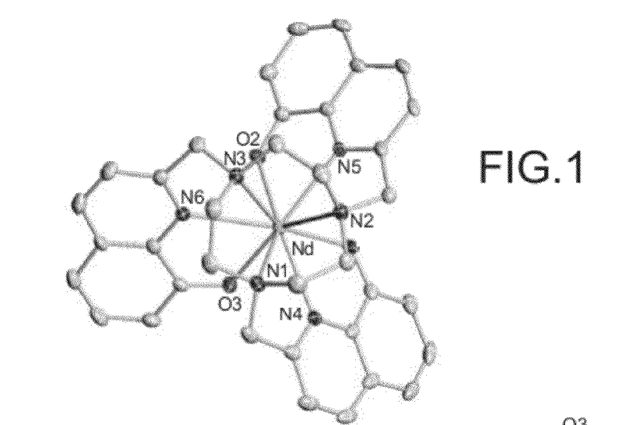
FIG. 1 is an ellipsoidal representation of the complex 1 as defined in the present invention, viewed from above (probability of 30%).

[Nd(thqtcn)] monocrystals that may be used for X-ray diffraction were obtained by slow diffusion of a KOH solution at 1 mM into a 4 mM methanol solution of 1:1:0.85 Nd:$H_3$thqtcn:KOH. Crystals that may be used for X-ray diffraction were also obtained for the complex [Eu(thqtcn)] (complex 2) by extraction with hot acetonitrile. The complex [Nd(thqtcn)] (complex 1) is shown in FIG. 1. The selected distances and angles are presented for complex 1 in Table 1 below.

TABLE 1

|  | [Nd(thqtcn)] |
| --- | --- |
| M-O(1) | 2.393(3) |
| M-O(2) | 2.409(3) |
| M-O(3) | 2.406(3) |
| M-N(1)mcy | 2.788(4) |
| M-N(3)mcy | 2.789(3) |
| M-N(2)mcy | 2.796(4) |
| M-N(4)py | 2.609(4) |
| M-N(5)py | 2.621(4) |
| M-N(6)py | 2.608(4) |

In the two complexes, the metal ion is co-ordinated 9 times with 9 donor atoms of the ligand: 3 nitrogens of the 1,4,7-triazacyclononane ring, 3 nitrogens and 3 oxygens of the hydroxyquinoline units. The hydroxyquinoline pendent arms bond the metal in a helical mode and the two L and D enantiomers are found in the crystallographic structure of the Nd complex resulting in a centrosymmetric space group P2(1)/c. The crystallographic structure of the Eu complex shows only the L enantiomer resulting in a chiral space group (R32). Similar structures have already been observed for the complex [Ln(tpatcn)] noncoordinated with tpatcn$H_3$=1,4,7-tris [(6-carboxypyrid-2-yl)methyl]-1,4,7-triazacyclononane and Ln=Nd, Eu, Gd or Lu [18].

Figure 2:
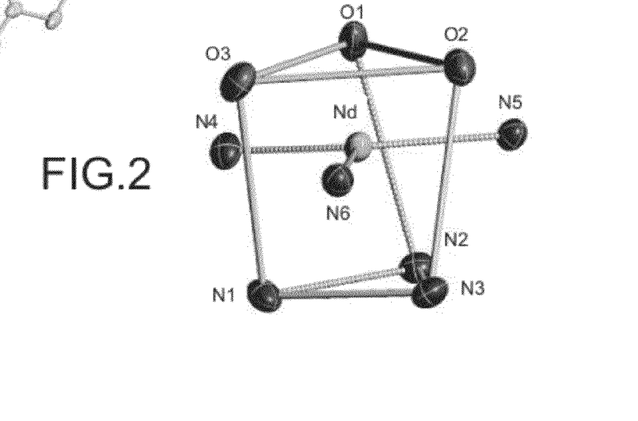
FIG. 2 proposes the coordination polyhedron of Nd in the [Nd(thqtcn)] complex.

The coordination polyhedron of [Nd(thqtcn)] may be described as a slightly distorted tricapped trigonal prism with $C_3$ pseudo-symmetry (FIG. 2). The complex [Eu(thqtcn)] also adopts a tricapped trigonal prismatic geometry, which has a $C_3$ crystallographic axis. In the two complexes, a triangular face is formed by the 3 nitrogens of the 1,4,7-triazacyclononane macrocycle, and a second by the 3 quinolinate oxygens. The three nitrogens of the hydroxyquinolate groups occupy the capping positions. The oxygen-based triangular faces are slightly twisted about the axis of the nitrogen-based faces. The mean value of the torsion angles formed by the atoms of the rectangular faces is 22.(2) for Nd and 19.2 (3) for Eu, whereas a slightly higher distortion from the regular trigonal geometry was found for the complexes [Nd(tpatcn)]

(24.2(8)) and [Eu(tpatcn)] 22.0(3). The planes defined by the two triangular faces are virtually parallel in the two complexes (angle between the planes of 0° for Eu and 2° for Nd).

II.2. Complex [Ln(H$_n$thqtcn)]$^{n+}$ with Ln=Nd, Yb

The partially protonated species were prepared in situ by mixing equimolar amounts of the ligand and of the appropriate salt Ln(OTf$_3$) in MeOD. Aliquots of a 1 M solution of KOD in D$_2$O were successively added and the formation of the complex was monitored by $^1$H-NMR. Addition of 0.85 equivalent of base is necessary to obtain total complexation of the ligand. However, beyond 0.85 equivalent, precipitation of a yellow powder took place.

[Nd(H$_n$thqtcn)]$^{n+}$. $^1$H NMR (CD$_3$OD, 400 MHz, 25° C.): δ=−1.50 (s, 1H, H$_{5a}$/H$_{5b}$), −0.12 (s, 1H, (CH$_2$)tcn), 5.09 (s, 1H, H$_{5a}$/H$_{5b}$), 6.68 (s, 1H, H$_9$), 6.83 (s, 1H, (CH$_2$)tcn), 6.83 (s, 1H, H$_{10}$), 7.47 (d, J=8.0 Hz, 1H, H$_8$), 8.40 (d, J=8.0 Hz, 1H, H$_6$), 8.62 (d, J=8.0 Hz, 1H, H$_7$), 9.10 (s, 1H, (CH$_2$)tcn), 9.91 (s, 1H, (CH$_2$)tcn). $^1$H NMR (CD$_3$OD, 400 MHz, 40° C.): δ=−1.08 (s, 1H, H$_{5a}$/H$_{5b}$), −0.01 (s, 1H, (CH$_2$)tcn), 5.03 (s, 1H, H$_{5a}$/H$_{5b}$), 6.53 (s, 1H, H$_9$), 6.73 (s, 1H, H$_{10}$), 6.84 (s, 1H, (CH$_2$)tcn), 7.50 (d, J=8.0 Hz, 1H, H$_8$), 8.41 (d, J=8.0 Hz, 1H, H$_6$), 8.67 (d, J=8.0 Hz, 1H, H$_7$), 8.72 (s, 1H, (CH$_2$)tcn), 8.43 (s, 1H, (CH$_2$)tcn).

[Yb(H$_n$thqtcn)]$^{n+}$. $^1$H NMR (CD$_3$OD, 400 MHz, 25° C.): δ=−12.11 (s, 1H, (CH$_2$)tcn), −4.88 (s, 1H, (CH$_2$)tcn), −3.70 (s, 1H, H$_{5a}$/H$_{5b}$), 2.77 (s, 1H, (CH$_2$)tcn), 4.59 (s, 1H, H$_{5a}$/H$_{5b}$), 4.59 (s, 1H, H$_{10}$), 7.87 (s, 1H, H$_9$), 8.25 (d, J=8.0 Hz, 1H, H$_8$), 9.23 (s, 1H, H$_6$), 9.95 (s, 1H, H$_7$), 15.16 (s, 1H, (CH$_2$)tcn). $^1$H NMR (CD$_3$OD, 400 MHz, 15° C.): δ=−13.16 (s, 1H, (CH$_2$)tcn), −5.41 (s, 1H, (CH$_2$)tcn), −4.18 (s, 1H, H$_{5a}$/H$_{5b}$), 3.60 (s, 1H, (CH$_2$)tcn), 4.47 (s, 1H, H$_{10}$), 5.55 (s, 1H, H$_{5a}$/H$_{5b}$), 7.89 (s, 1H, H$_9$), 8.27 (d, J=8.0 Hz, 1H, H$_8$), 9.25 (d, J=8.0 Hz, 1H, H$_6$), 9.99 (d, J=8.0 Hz, 1H, H$_7$), 15.80 (s, 1H, (CH$_2$)tcn).

Slow diffusion of isopropyl ether into the above solutions made it possible to obtain yellow crystals that could be used for X-ray diffraction.

II.3. Complex [Ln(thqtcn-SO$_3$)]$^{3−}$ with Ln=Nd, Er, Yb

Solubility in water is essential for use of the lanthanide complexes as luminescent probes for biomedical imaging. The characteristic sulfonyl group is known to aid the dissolution in water of hydrophobic species by the formation of negatively charged species. Thus, H$_3$thqtcn-SO$_3$, an analogue of H$_3$thqtcn, was prepared.

The complexes for the $^1$H NMR and luminescent measurements were prepared in situ by mixing stoichiometric amounts of the ligand H$_6$thqtcn-SO$_3$ and of the appropriate Ln(OTf)$_3$. $^1$H NMR was performed in D$_2$O after adjusting the pD value with a solution of KOD. 1 mM solutions of the [Ln(thqtcn-SO$_3$)]$^{3−}$ complexes in TBS at 0.1 M (pH=7.4) were used for the luminescence studies.

[Nd(thqtcn-SO$_3$)]$^{3−}$. $^1$H NMR (D$_2$O, 400 MHz, 25° C., pD 7.7): δ=0.46 (s, 1H, (CH$_2$)tcn), 0.78 (s, 1H, (CH$_2$)tcn), 1.68 (s, 1H, (CH$_2$)tcn), 4.82 (s, 1H, (CH$_2$)tcn), 5.46 (s, 1H, H$_{5a}$/H$_{5b}$), 5.97 (s, 1H, H$_{5a}$/H$_{5b}$), 6.87 (d, J=7.0 Hz, 1H, H$_{10}$), 8.89 (d, J=7.0 Hz, 1H, H$_9$), 9.83 (d, J=8.0 Hz, 1H, H$_6$), 10.32 (d, J=8.0 Hz, 1H, H7). $^1$H NMR (D$_2$O, 400 MHz, 70° C., pD 7.7): δ=0.62 (s, 1H, (CH$_2$)tcn), 1.30 (s, 1H, (CH$_2$)tcn), 1.75 (s, 1H, (CH$_2$)tcn), 4.50 (s, 1H, (CH$_2$)tcn), 5.16 (s, 1H, H$_{5a}$/H$_{5b}$), 5.54 (s, 1H, H$_{5a}$/H$_{5b}$), 6.81 (d, J=7.0 Hz, 1H, H$_{10}$), 8.75 (d, J=7.0 Hz, 1H, H$_9$), 9.46 (d, J=8.0 Hz, 1H, H$_6$), 10.52 (d, J=8.0 Hz, 1H, H$_7$).

Figure 3:
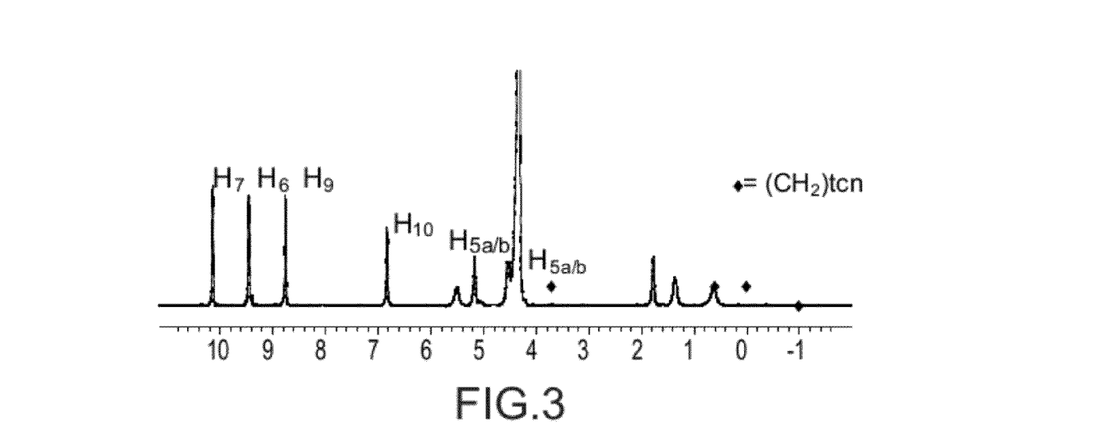
FIG. 3 shows the $^1H$ NMR spectrum of an Nd solution: thqtcn-$SO_3$ (1:1) in a solution of $D_2O$ with a pD of 7.7; at 70° C. and at 400 MHz.

As hoped, this ligand results in Ln(III) complexes that are water-soluble at physiological pHs. The spectrum of an Nd:thqtcn-SO$_3$ (1:1) solution in D$_2$O at 70° C. and at pD=7.7 shows the presence of 4 signals assigned to the twelve protons of the 1,4,7-triazacyclononane macrocycle (d=0.62, 1.30, 1.75 and 4.50 ppm), 2 signals for the protons of the 6 methylenes of the ligand arms (d=5.16 and 554 ppm) and 4 signals corresponding to the 5 aromatic protons of hydroxyquinoline (d=6.81, 8.75, 9.46 and 10.52 ppm) (FIG. 3).

Thermodynamic and kinetic stability in water at a physiological pH is a crucial property for the application of the lanthanide complexes as luminescent tags in biological systems. The high water solubility of the thqtcn-SO$_3$$^{6−}$ complexes incited the inventors to study their stability in order to evaluate their application potential.

Appreciably, the interaction between the lanthanide ions and the ligand was monitored by UV-visible spectrophotometry for a representative ion of intermediate size, namely Gd in dilute aqueous solutions, buffered with HEPES at pH 7.4. The value of pGd (pM=−log [M]$_{free}$ at pH 7.4, [M]$_{total}$=1 mM and [bpatcn]$_{total}$=10 mM), which allows a simple and direct comparison of the stabilities of the complexes under physiological conditions, found for thqtcn-SO$_3$$^{6−}$(19) is similar to the value reported for the gadolinium complexes of diethylenetriaminepentaacetic acid (dtpa) (pGd=19.6), which are widely acknowledged as non-toxic. The high stability at a physiological pH and the high kinetic stability of the complex of gadolinium with the thqtcn-SO$_3$$^{6−}$ ligand indicate that the complexes of lanthanide with the thqtcn-SO$_3$$^{6−}$ ligand are particularly suitable for applications as probes in biomedical imaging.

Furthermore, it has been demonstrated that, at the concentrations and pH used, the thqtcn-SO$_3$ complex does not dissociate in water, does not contain any coordinated water molecules and has a rigid and rather well-defined inner coordination sphere.

II.4. Synthesis of Lanthanide Complexes Having as Ligand H$_3$tpatcn

This synthesis was performed according to the protocols described by Gateau et al., 2003 [18].

III. Incorporation of the Lanthanide Complexes into a Silica Bead

The protocol used for this incorporation is as follows:
preparation of a solution comprising 1.65 mL of Triton X-100 (nonionic surfactant), 1.6 mL of hexanol, 7.5 mL of cyclohexane, 80 μL of aqueous solution of the lanthanide complex, namely Eu(tpatcn) at 0.1 M, 100 μL of aqueous ammonium (30% by mass) and 400 μL of water;
stirring of the said solution for 30 minutes, at room temperature;
addition of 100 μL of TEOS;
stirring for 24 hours, at room temperature.

This protocol consists in forming a water-in-oil microemulsion containing nanoreactors in which will take place the growth of the silica layer. The lanthanide complexes that have been dissolved in water will thus migrate within the nanoreactors and become trapped in the silica matrix under construction.

Figure 4:
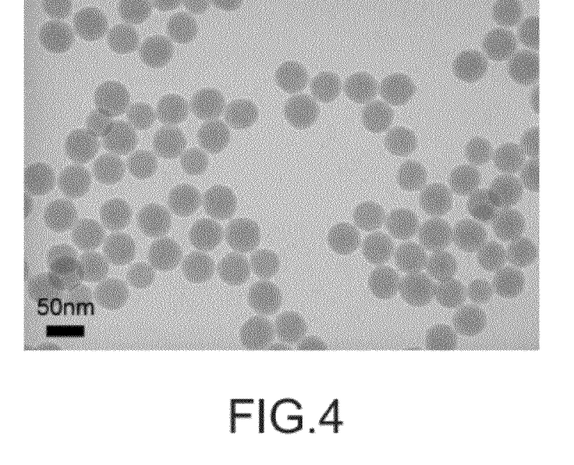
FIG. 4 is a transmission electron microscopy (TEM) image of silica nanoparticles comprising organolanthanide complexes according to the present invention, dispersed in ethanol.

This synthesis makes it possible to obtain spherical luminescent nanoparticles 40 nm in size, perfectly dispersed in a solvent such as ethanol. The TEM image is evidence thereof (FIG. 4).

IV. Photophysical Properties of Silica Nanoparticles Comprising Lanthanide Complexes According to the Invention All the $Eu^{III}$ and $Yb^{III}$ chelates of the thqtcn-$SO_3^{6-}$ ligand, both in solution and inserted into silica, show NIR luminescent products centred on the metal in buffered aqueous solutions (pH 7.4), with virtually no residual emission of the ligands, which indicates efficient energy transfer.

The complexes allow a large "antenna" effect associated with excitation wavelengths at low energy for the $Yb^{III}$ complex, compared with nanoparticles containing lanthanide oxides, which require a high excitation energy.

Furthermore, the emission of the chelates in solution or inserted into silica nanoparticles shows an emission spectrum with perfect overlap, indicating that the symmetry of the chelates is preserved in the nanoparticles. Finally, there is no interaction between the lanthanide ion and the silica lattice.

The observed lifetimes of 1.08 and 1.23 ms for the [Eu(tpatcn)] complex dissolved in water or encapsulated in silica, respectively, are comparable with the values measured for the podates, indicating that silica affords better protection to the $Ln^{III}$ ion with respect to its environment and non-radiative deactivation processes.

The lifetimes measured in solution in water for the [Yb(thqtcn-$SO_3$)] chelates show similar results with 2.05 and 4.17 ms, respectively, in solution and encapsulated. Furthermore, the increase is twice as high as the lifetimes of the [Eu(tpatcn)] complex due to the fact that the $Yb^{III}$ ion is much more sensitive to luminescence quenching by high-energy vibrations.

The quantum yields for the $Eu^{III}$ and $Yb^{III}$ chelates were measured at pH 7.4 and at room temperature. In both cases, the visible and NIR luminescence of 1:1 $Ln^{III}$ chelates is sufficiently intense in aqueous solution to enable determination of the quantum yields. These chelates show relatively high quantum yields when compared with the data published in the literature, in particular for $Yb^{III}$ and for the aqueous solutions. A quantum yield as high as 0.11% was obtained for the $Yb^{III}$ chelate inserted into silica nanoparticles (0.14% in solution) and 1.6% for the $Eu^{III}$ chelate (9.0% in solution). Specifically, it is well known that the $Ln^{III}$ ions that emit in the near infrared region, on account of their small prohibited band, are very sensitive to photobleaching by immediate oscillators, such as O—H, N—H, or even C—H. A quantum yield of 0.11% is among the highest quantum yields observed in aqueous solution.

These luminescence quantum yields of the chelates in solution and inserted into silica nanoparticles are closer, taking the absorption of silica into account. By calculating and by considering that no other deactivation route is changed between the chelates during the lifetime measurements, we can estimate that the decrease in the quantum yields is the result of the absorption of silica. In point of fact, pure silica has absorption and excitation wavelengths of between 200 and 500 nm. Like the measurements of the quantum yield resulting from an absolute method with an integration sphere, the absorption of photons by the nanoparticles is not correlated to the emission of photons by the lanthanide ion. Part of the excitation energy is absorbed by the silica and released via non-radiative deactivation processes without transfer to the complexes.

The contribution of this absorption may be estimated by comparing $Eu^{III}$ and $Yb^{III}$ complexes. In the case of $Eu^{III}$ nanoparticles, the excitation wavelength is 270 nm, resulting in absorption of about 80% of the energy by silica, whereas this absorption is only about 20% for the $Yb^{III}$ complex, which is more sensitive to the deactivation processes. The explanation is that at 300 nm (excitation of the $Eu^{III}$ nanoparticles), the absorption of pure silica is much higher than at 390 nm (excitation of the $Yb^{III}$ nanoparticles).

It has thus been demonstrated that silica acts as an efficient host for $Ln^{III}$ chelates, which have longer lifetimes than in solution. These luminescence measurements indicate that there is no observable quenching effect and no interaction between the silica lattice and the lanthanide chelates in the nanoparticle. Furthermore, insertion of the chelates into silica has virtually no effect on the photophysical properties of the chelates (lifetime, quantum yields and luminescence spectrum).

V. Protective Silica Shell and Functionalization of the Surface of Silica

The following protocol was used to obtain a silica nanoparticle comprising at least one lanthanide complex and onto the surface of which is grafted an amine function:

preparation of a solution comprising 1.65 mL of Triton X-100 (nonionic surfactant), 1.6 mL of hexanol, 7.5 mL of cyclohexane, 80 µL of aqueous solution of the lanthanide complex, namely Eu(tpatcn) at 0.1 M, 100 µL of aqueous ammonium (30% by mass) and 400 µL of water;

stirring of the said solution for 30 minutes, at room temperature;

addition of 100 µL of TEOS;

stirring for 24 hours, at room temperature;

addition of 15 µL TEOS and 15 µL of APTES used to obtain a grafted amine function, at room temperature;

stirring for 24 hours, at room temperature.

Figure 5:
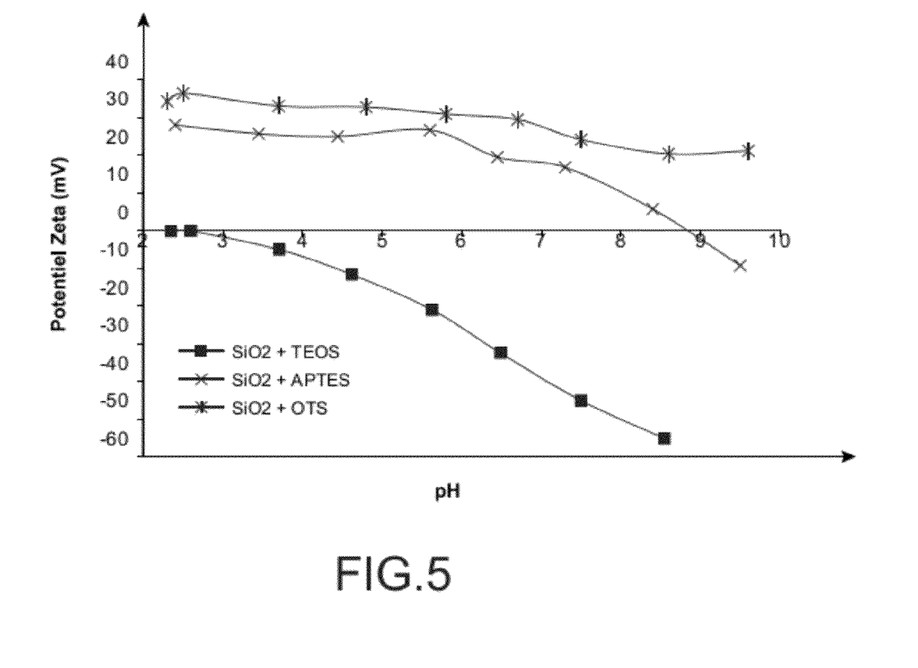
FIG. 5 shows graphically the measurement of the zeta potential of silica nanoparticles comprising organolanthanide complexes according to the present invention.

A measurement of the zeta potential of the nanoparticles thus obtained makes it possible to characterize the surface modification. The curves given in FIG. 5 show a modification of the surface charge and thus functionalization of the surface, a hydrophilic amine function having indeed been grafted onto the surface of the nanoparticle.

It should be pointed out that the addition of TEOS makes it possible to produce a silica shell around the matrix initially created. This shell enables a neutral surface state of the silica to be regained. Specifically, a zeta potential measurement shows that the incorporation of the complexed molecule does not take place solely inside the silica matrix but also at the surface thereof. By growing this new layer of silica, the presence of lanthanide complexes at the surface is dispensed with and, as a result, the surface state of neutral silica is regained. The lanthanide complex is therefore no longer in contact with the external medium.

The invention claimed is:

1. Silica particle comprising at least one complex of at least one lanthanide and at least one ligand of formula (A):

in which

Z$_1$, Z$_2$ and Z$_3$, which may be identical or different, each represent a group bearing an atom bearing a lone pair and/or a negative charge, R$_1$, R$_2$, R$_3$, R$_4$, R$_5$, R$_6$, R$_7$, R$_8$, R$_9$, R$_{10}$, R$_{11}$ and R$_{12}$, which may be identical or different, each represent a hydrogen, an optionally substituted alkyl radical, an optionally substituted aryl radical, a halogen, a group —OR$_{13}$ or a group —SR$_{13}$, with R$_{13}$ representing H, an optionally substituted alkyl group or an optionally substituted aryl group;

wherein each group bearing an atom bearing a lone pair and/or a negative charge is selected from the group consisting of the groups of formulae (B), (E), (F), and (H):

in which
R$_{21}$ represents a single bond or R$_{21}$ represents a radical =CR$_{23}$—, R$_{17}$ then being absent;
R$_{22}$ represents a single bond or R$_{22}$ represents a radical =CR$_{23}$=, R$_{19}$ then being absent;
G represents an O, N, P, S or a C independently substituted with a hydrogen, an optionally substituted alkyl radical or an optionally substituted aryl radical,
the radicals R$_{16}$, R$_{17}$, R$_{18}$, R$_{19}$, R$_{20}$, R$_{23}$, R$_{30}$, R$_{31}$, R$_{32}$, R$_{33}$, R$_{34}$, R$_{35}$, R$_{36}$, R$_{37}$ and R$_{38}$, which may be identical or different, represent a hydrogen, an optionally substituted alkyl radical, an optionally substituted aryl radical, a halogen, a radical —SO$_3$H, a radical —SO$_3^-$, a group —OR$_{13}$ or a group —SR$_{13}$ with R$_{13}$ representing H, an optionally substituted alkyl group or an optionally substituted aryl group.

2. Silica particle according to claim 1, characterized in that the said lanthanide is chosen from the group constituted by cerium (Ce), neodymium (Nd), europium (Eu), gadolinium (Gd), terbium (Tb), erbium (Er) and ytterbium (Yb).

3. Silica particle according to claim 1, characterized in that the said group bearing an atom bearing a lone pair of electrons and/or a negative charge bears at least one function chosen from the group constituted by a hydroxyl function, an ester function, a carboxylic acid function, an amine function, an amide function, an oxime function, an isocyanate function, an isonitrile function, a hydrazine function, a hydrazone function, an imine function and a phosphine function.

4. Silica particle are as defined in claim 1, characterized in that the said group of formula (B) is chosen from:
the group (B$_1$) of formula (B) in which R$_{22}$ represents a radical —C(SO$_3^-$)= and R$_{16}$, R$_{17}$, R$_{18}$, and R$_{20}$ which may be identical or different, represent a hydrogen, an optionally substituted alkyl radical, an optionally substituted aryl radical, a halogen, a radical —SO$_3$H, a radical —SO$_3^-$, a group —OR$_{13}$ or a group —SR$_{13}$, with R$_{13}$ representing H, an optionally substituted alkyl group or an optionally substituted aryl group;
the group (B$_2$) of formula (B) in which R$_{16}$=R$_{18}$=R$_{20}$=H; R$_{21}$=a radical =CH— and R$_{22}$=a radical —CH=, R$_{17}$ and R$_{19}$ being absent;
the group (B$_3$) of formula (B) in which R$_{16}$=R$_{18}$=R$_{20}$=H; R$_{21}$=a radical =CH— and R$_{22}$=a radical —C(SO$_3^-$)=, R$_{17}$ and R$_{19}$ being absent.

5. Silica particle according to claim 1, characterized in that the said complex is in the form of a coordination complex of general formula (I)

$$[Ln(L)(H_2O)_n] \qquad (I)$$

in which Ln represents a lanthanide as defined in claim 1, L is a ligand of formula (A) as defined in claim 1, and n is an integer ranging from 0 to 6.

6. Silica particle according to claim 1, characterized in that the said particle is of nanometric to micrometric sizes.

7. Silica particle according to claim 1, characterized in that the said complex is encapsulated in the said silica particle.

8. Silica particle according to claim 7, characterized in that the said silica particle is functionalized.

9. Silica particle according to claim 1, characterized in that the said complex is at the surface of the said particle.

10. Process for preparing a silica particle comprising at least one complex of at least one lanthanide and of at least one ligand of formula (A) as defined in claim 9, comprising the following steps:
a') grafting, directly or indirectly, onto a silica particle at least one ligand of formula (A) optionally complexed with at least one lanthanide selected from the group consisting of cerium (Ce), neodymium (Nd), europium (Eu), gadolinium (Gd), terbium (Tb), erbium (Er) and ytterbium (Yb),
b') optionally placing in contact the grafted silica particle obtained in step (a') with at least one lanthanide selected from the group consisting of cerium (Ce), neodymium (Nd), europium (Eu), gadolinium (Gd), terbium (Tb), erbium (Er) and ytterbium (Yb).

11. Process for preparing a silica particle comprising at least one complex of at least one lanthanide and of at least one ligand of formula (A) as defined in claim 7, characterized in that the said process comprises the steps consisting in:
a) encapsulating, in a silica particle, at least one complex comprising at least one lanthanide and at least one ligand of formula (A); and
b) optionally functionalizing the said silica particle obtained in step (a).

12. Process according to claim 11, characterized in that the said step (a) consists in:
- c) using a silica particle onto which is grafted at least one complex comprising at least one lanthanide and at least one ligand of formula (a) that may be obtained via the process as defined in claim 16, and then
- d) coating the said particle with a layer of silica.

13. Process according to claim 11, characterized in that the said step (a) consists in:
- e) placing in contact a porous silica particle with at least one ligand of formula (A) as complexed with at least one lanthanide,
- f) placing in contact the silica particle obtained in step (e) with at least one lanthanide,
- g) optionally, coating the particle obtained in step (f) with a layer of silica.

14. Process according to claim 11, characterized in that the said step (a) consists in:
- h) placing in contact at least one complex comprising at least one lanthanide and at least one ligand of formula (A) with at least one silica precursor under conditions for obtaining a silica particle,
- i) optionally, coating the said particle obtained in step (h) with a layer of silica.

15. Biological tracer comprising a silica particle as defined in claim 1.

16. Tracer for anti-counterfeit marking comprising a silica particle as defined in claim 1.

\* \* \* \* \*